(12) United States Patent
Schulze et al.

(10) Patent No.: US 11,569,392 B2
(45) Date of Patent: Jan. 31, 2023

(54) POWER SEMICONDUCTOR DIODE INCLUDING FIELD STOP REGION

(71) Applicant: Infineon Technologies AG, Neubiberg (DE)

(72) Inventors: Hans-Joachim Schulze, Taufkirchen (DE); Christian Jaeger, Munich (DE); Moriz Jelinek, Villach (AT); Daniel Schloegl, Villach (AT); Benedikt Stoib, Feldkirchen-Westerham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/466,342

(22) Filed: Sep. 3, 2021

(65) Prior Publication Data
US 2022/0085215 A1 Mar. 17, 2022

(30) Foreign Application Priority Data
Sep. 14, 2020 (DE) .......................... 102020123847.9

(51) Int. Cl.
*H01L 29/861* (2006.01)
*H01L 29/06* (2006.01)
(Continued)

(52) U.S. Cl.
CPC .......... *H01L 29/861* (2013.01); *H01L 21/265* (2013.01); *H01L 29/0603* (2013.01);
(Continued)

(58) Field of Classification Search
CPC . H01L 29/861; H01L 21/265; H01L 29/0603; H01L 29/0834; H01L 29/66136; H01L 29/8611; H01L 29/0619; H01L 2924/12031; H01L 29/868; H01L 2924/12036; H01L 29/872–8725; H01L 29/66143; H01L 29/66212; H01L 27/0766; H01L 51/0579; H01L 29/36–365
See application file for complete search history.

(56) References Cited

U.S. PATENT DOCUMENTS

| 10,049,880 B2 * | 8/2018 | Mizushima ............ H01L 29/32 |
| 2015/0206983 A1 | 7/2015 | Felsl et al. |

(Continued)

*Primary Examiner* — Shahed Ahmed
(74) *Attorney, Agent, or Firm* — Murphy, Bilak & Homiller, PLLC

(57) ABSTRACT

A power semiconductor diode includes a semiconductor body having first and second main surfaces opposite to each other along a vertical direction. A drift region of a second conductivity type is arranged between an anode region of a first conductivity type and the second main surface. A field stop region of the second conductivity type is arranged between the drift region and the second main surface. A dopant concentration profile of the field stop region along the vertical direction includes a maximum peak. An injection region of the first conductivity type is arranged between the field stop region and the second main surface, with a pn-junction between the injection and field stop regions. A cathode contact region of the second conductivity type is arranged between the field stop region and the second main surface. A first vertical distance between the pn-junction and the maximum peak ranges from 200 nm to 1500 nm.

20 Claims, 3 Drawing Sheets

(51) Int. Cl.
*H01L 29/66* (2006.01)
*H01L 21/265* (2006.01)
*H01L 29/08* (2006.01)
*H01L 29/36* (2006.01)

(52) U.S. Cl.
CPC .......... *H01L 29/0834* (2013.01); *H01L 29/36* (2013.01); *H01L 29/66136* (2013.01)

(56) References Cited

U.S. PATENT DOCUMENTS

2017/0133465 A1   5/2017  Mauder et al.
2019/0081163 A1*  3/2019  Mizukami ........... H01L 27/0727
2019/0280613 A1*  9/2019  Fujii ....................... H01L 29/36

* cited by examiner

# POWER SEMICONDUCTOR DIODE INCLUDING FIELD STOP REGION

TECHNICAL FIELD

The present disclosure is related to semiconductor devices, in particular to power semiconductor diodes including a field stop region.

BACKGROUND

In semiconductor diodes mobile charge carriers may flood a semiconductor region and may form a dense charge carrier plasma that yields a low forward resistance of the semiconductor diode. The charge carrier plasma is removed in a turn-off period when the device turns into blocking mode. The turn-off process contributes to the dynamic switching losses of the semiconductor diode. Typically, a desaturation mechanism may attenuate the charge carrier plasma before switching the diode in order to reduce the dynamic switching losses. When turning-off the diode, inhomogeneous carrier injection may lead to current filaments that may locally heat up and damage the diode. It is desirable to provide semiconductor diodes with improved switching characteristics.

SUMMARY

An example of the present disclosure relates to a power semiconductor diode. The power semiconductor diode includes a semiconductor body having a first main surface and a second main surface opposite to each other along a vertical direction. The power semiconductor diode further includes an anode region of a first conductivity type. The power semiconductor diode further includes a drift region of a second conductivity type. The drift region is arranged between the anode region and the second main surface. The power semiconductor diode further includes a field stop region of the second conductivity type. The field stop region is arranged between the drift region and the second main surface. A dopant concentration profile of the field stop region along the vertical direction includes a maximum peak. The power semiconductor diode further includes an injection region of the first conductivity type. The injection region is arranged between the field stop region and the second main surface. A pn-junction is formed between the injection region and the field stop region. The power semiconductor diode further includes a cathode contact region of the second conductivity type. The cathode contact region is arranged between the field stop region and the second main surface. A first vertical distance between the pn-junction and the maximum peak ranges from 200 nm to 1500 nm.

Another example of the present disclosure relates to a method of manufacturing a power semiconductor device. The method includes providing a semiconductor body having a first main surface and a second main surface opposite to each other along a vertical direction. The method further includes forming an anode region of a first conductivity type in the semiconductor body. The method further includes forming a drift region of a second conductivity type. The drift region is arranged between the anode region and the second main surface. The method further includes forming a field stop region of the second conductivity type. The field stop region is arranged between the drift region and the second main surface. A dopant concentration profile of the field stop region along the vertical direction includes a maximum peak. The method further includes forming an injection region of the first conductivity type. The injection region is arranged between the field stop region and the second main surface. A pn-junction is formed between the injection region and the field stop region. The method further includes forming a cathode contact region of the second conductivity type. The cathode contact region is arranged between the field stop region and the second main surface. A first vertical distance between the pn-junction and the maximum peak ranges from 200 nm to 1500 nm.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of semiconductor diodes, e.g. vertical power semiconductor diodes and together with the description serve to explain principles of the embodiments. Further embodiments are described in the following detailed description and the claims.

DETAILED DESCRIPTION

Figure 1:
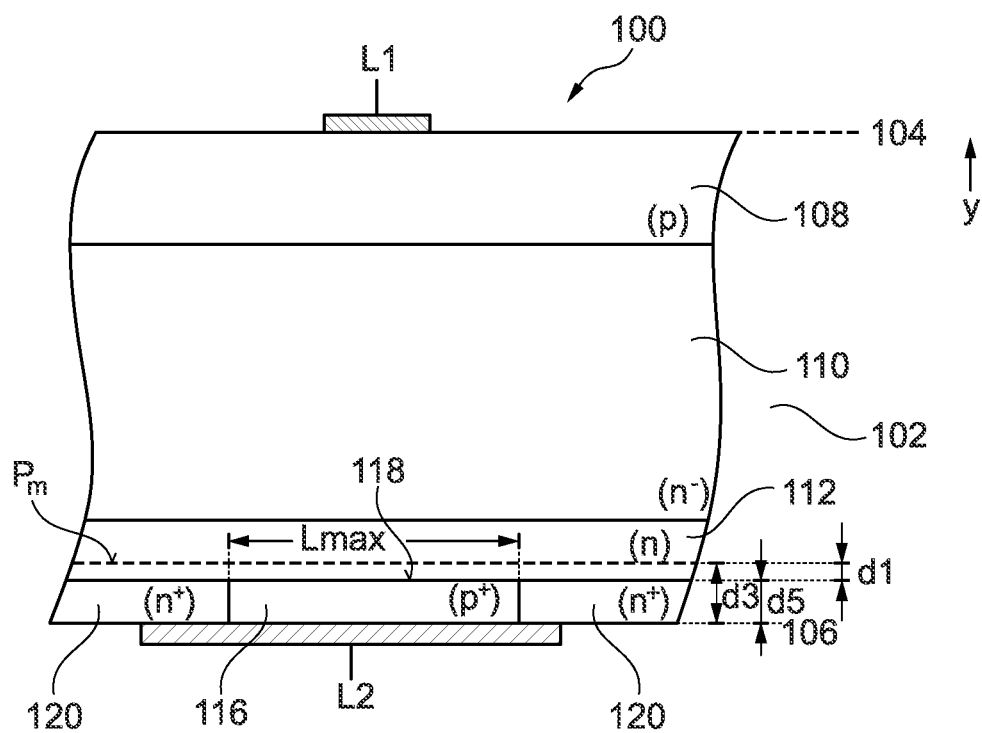
FIG. 1 is a schematic cross-sectional view for illustrating an example of a vertical power semiconductor diode.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

Ranges given for physical dimensions include the boundary values. For example, a range for a parameter y from a to b reads as a≤y≤b. A parameter y with a value of at least c reads as c≤y and a parameter y with a value of at most d reads as y≤d.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a power semiconductor diode may include a semiconductor body having a first main surface and a second main surface opposite to each other along a vertical direction. The power semiconductor diode may further include an anode region of a first conductivity type. The power semiconductor diode may further include a drift region of a second conductivity type. The drift region is arranged between the anode region and the second main surface. The power semiconductor diode may further include a field stop region of the second conductivity type. The field stop region is arranged between the drift region and the second main surface. A dopant concentration profile of the field stop region along the vertical direction may include a maximum peak. The power semiconductor diode may further include an injection region of the first conductivity type. The injection region may be arranged between the field stop region and the second main surface. A pn-junction is formed between the injection region and the field stop region. The power semiconductor diode may further include a cathode contact region of the second conductivity type. The cathode contact region may be arranged between the field stop region and the second main surface. A first vertical distance between the pn-junction and the maximum peak may range from 200 nm to 1500 nm.

The power semiconductor diode may be a vertical power semiconductor diode having a load current flow between a first load terminal at the first main surface and a second load terminal at a second main surface opposite to the first main surface. The vertical power semiconductor diode may be configured to conduct currents of more than 1A or more than 10 A or even more than 30 A and may be further configured to block voltages between load terminals, e.g. between cathode and anode in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

The first main surface may be a level at an interface between the semiconductor body and a wiring area above the semiconductor body at a first side, e.g. front side of the semiconductor body. The second main surface may be a level at an interface between the semiconductor body and a contact above the semiconductor body at a second side, e.g. rear or back side of the semiconductor body.

The anode region may be a p-doped region electrically connected to an anode terminal at the first main surface of the semiconductor body. The anode region may be formed by one or a plurality of anode sub-regions. The anode sub-regions may differ from one another with respect to at least one of dopant species, doping concentration profile, vertical extension. The anode sub-regions may overlap one another and form a continuous anode region, for example. For example, the anode region may be formed by an ion implantation process with subsequent drive-in steps. Anode sub-regions may be formed by a plurality of ion implantation processes with subsequent drive-in steps having different ion implantation energies and/or ion implantation doses. For example, the anode region may adjoin a contact at the first main surface.

For example, the anode terminal may be a contact area and be formed by all or part of a wiring layer. For example, the wiring layer may correspond to one wiring level of a wiring area above the first main surface, wherein the one wiring level of the wiring area may be located closest to the first main surface in case of multiple wiring levels. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an intermediate dielectric may be arranged. Contact plug(s) or contact line(s) may be formed in openings in the intermediate dielectric to electrically connect parts, e.g. metal lines or contact areas, of different wiring levels to one another. For example, the contact area of the anode terminal may be electrically connected to the anode region in the semiconductor body by contact plugs arranged between the anode region and the contact area of the anode terminal.

For example, an impurity concentration in the drift region may gradually or in steps increase or decrease with increasing distance to the first main surface at least in portions of its vertical extension. According to other examples the impurity concentration in the drift region may be approximately uniform. For power semiconductor diodes based on silicon, a mean impurity concentration in the drift region may be between $2 \times 10^{12}$ cm$^{-3}$ and $1 \times 10^{15}$ cm$^{-3}$, for example in a range from $5 \times 10^{12}$ cm$^{-3}$ to $2 \times 10^{14}$ cm$^{-3}$. In the case of a power semiconductor diode based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements, e.g. a specified voltage class, of the vertical power semiconductor device. When operating the vertical power semiconductor diode in voltage blocking mode, a space charge region may vertically extend partly or totally through the drift region depending on the blocking voltage applied to the vertical power semiconductor device. When operating the vertical power semiconductor diode at or close to the specified maximum blocking voltage, the space charge region may reach or penetrate into the field stop region.

The field stop region is configured to prevent the space charge region from further reaching to a cathode contact at the second main surface of the semiconductor body. In this manner, the drift region may be formed using desired low doping levels and with a desired thickness while achieving soft switching for the semiconductor diode thus formed.

Since the field stop region aims at preventing the space charge region from reaching the cathode contact at the second main surface of the semiconductor body in a voltage blocking mode at or around maximum specified voltage blocking capabilities of the semiconductor diode, a mean net impurity concentration in the field stop layer may be higher than in the drift region by at least one order of magnitude, for example. Moreover, the mean net impurity concentration in the field stop layer may be lower than the impurity concentration in the cathode contact region by at least one order of magnitude, for example.

The cathode contact region may provide an ohmic contact to the cathode contact at the second main surface and may also contribute to the diode functionality by injecting charge carriers of the second conductivity type, e.g. electrons into the drift region in a forward-bias operation mode of the power semiconductor diode. The injection region between the field stop region and the second main surface has a conductivity type different from the cathode contact region. The injection region may have an average doping concentration ranging from $10^{17}$ cm$^{-3}$ to $10^{20}$ cm$^{-3}$, or from $10^{18}$ cm$^{-3}$ to $10^{19}$ cm$^{-3}$. The injection region may be configured to improve softness of the diode switching behavior by injecting holes into the drift zone of the diodes during the turn-off process.

The partial transistor gain Alpha$_{pnp}$ of the transistor formed by the p-doped injection region, the n-doped field stop zone and the frontside p-doped emitter, may be enhanced by a minimization of the neutral zone, formed between the space charge layer and the p-doped injection regions, resulting in a relatively high transport factor. This may allow for improving the hole injection of the injection regions during a turn-off period of the power semiconductor device, thereby suppressing a too high current decrease during the turn-off period of the power semiconductor device and with it suppressing detrimental overvoltages during turn-off, for example.

For example, the dopant concentration profile of the field stop region may decrease, along the vertical direction toward the first main surface, from the maximum peak to half of the maximum peak at a second vertical distance to the pn-junction. A ratio between the second vertical distance and the first vertical distance may range from 1.42 and 2.2. Since the dopants around the maximum peak provide a major contribution of the transverse conductivity of the current path biasing the injection region, the dopant concentration profile allows for locating the transverse conduction path close to the injection region. This may allow for improving softness of the diode switching behavior.

For example, a dose of dopants of the field stop region of silicon-based devices is smaller than $1 \times 10^{13}$ cm$^{-2}$. The dose of dopants of the field stop region may correspond to a number of implanted and electrically activated dopants per unit area (atoms/cm$^2$). For, example, proton implantation may be followed by thermal annealing in a temperature range from 360° C. to 420° C. for a time period ranging from 30 minutes to 5 hours for electrically activating hydrogen related donors. The dose may be determined by integrating a profile of the implanted and electrically activated dopant concentration along the vertical extension of the field stop region. The profile of the dopants of the field stop region may be determined by one or more of depth profiling of dopants and contaminants using secondary ion mass spectrometry (classic dynamic SIMS and TOF (time of flight)-SIMS), spreading resistance profiling (SRP), or scanning probe techniques for 2D-profiling, for example.

For example, the dopant concentration profile of the field stop region along the vertical direction may include a single peak. The single peak may be formed by a single ion implantation process, for example. Broadening of the dopant concentration profile may be achieved, for example, by carrying out a plurality of ion implantation processes at constant or almost constant ion implantation energy but different tilt angles and/or ion implantation doses. This may allow for broadening the single peak, thereby forming a substantially box-like profile having a plateau with a vertical extension of at least 300 nm, or at least 500 nm, for example. For example, a vertical distance between the single peak may and the second main surface may range from 1200 nm to 3000 nm, or from 1500 nm to 2500 nm, for example.

For example, the dopant concentration profile of the field stop region along the vertical direction may include a second peak. The maximum peak may be located between the second peak and the second main surface. While the maximum peak may contribute to improving the switching characteristics of the power semiconductor diode, the second peak may allow for reducing a leakage current, and may thus contribute to reducing energy dissipation of the power semiconductor diode, for example.

For example, the dopant concentration profile of the field stop region along the vertical direction may include a minimum between the maximum peak and the second peak. A dopant concentration ratio between the minimum and the second peak may range from 0.7 to 0.95.

For example, the power semiconductor diode may further have a third vertical distance between the maximum peak and the second main surface, and a fourth vertical distance between the maximum peak and the second peak. A ratio between the fourth vertical distance and the third vertical distance may range from 0.5 to 2.0. This may allow for an improved turn-off softness and with it the avoidance of too large voltage overshoots by an effective hole injection into the drift zone of the diodes during the turn-off process.

For example, the third vertical distance may be smaller than 2.5 µm.

For example, the dopant concentration profile of the field stop region along the vertical direction may include at least one minimum. A dopant concentration of the at least one minimum may be at least a factor ten greater than a mean dopant concentration of the drift region. The mean dopant concentration of the drift region may be a dopant concentration that is averaged along a vertical extension of the drift region, e.g. averaged from the field stop region to the anode region.

For example, a dopant concentration ratio between a maximum dopant concentration of the injection region and the maximum peak may be greater than 10, or greater than 100. For example, a dopant concentration ratio between a maximum dopant concentration of the injection region and the maximum peak may be smaller than 50000, or smaller than 10000. For example, a dopant concentration ratio between a maximum dopant concentration of the injection region and the maximum peak may range from 10 to 50000, or from 100 to 10000, for example.

For example, a maximum dopant concentration of the cathode contact region may be at least a factor 5 greater than a maximum dopant concentration of the injection region. This may allow for balancing between the diode functionality of the cathode contact region acting as an electron emitter region and the injection region acting as a hole emitter during diode turn-off.

For example, the power semiconductor diode may have a fifth vertical distance between the second main surface and the pn-junction. The fifth vertical distance may range from 200 nm to 500 nm.

For example, the field stop region may include hydrogen-related donors. The hydrogen related donors may be formed by one or more proton implantation processes followed by thermal processing for electrically activating hydrogen related donors, e.g. annealing between 30 minutes and 5 hours in a temperature range from 360° C. to 420° C.

For example, a maximum lateral extension of the injection region may range from $10^{-17}$ cm$^4$ times a dopant concentration of the maximum peak to $10^{-14}$ cm$^4$ times a dopant concentration of the maximum peak. By appropriately adjusting the maximum lateral extension, biasing of the injection region caused by a voltage drop along the transverse current path in the field stop region may be tuned, and thus hole injection by the injection region may be adjusted.

For example, the power semiconductor device may further have a sixth vertical distance between the maximum peak and an interface between the field stop region and the cathode contact region. The first vertical distance may be smaller than the sixth vertical distance. This may allow for reducing recombination of holes in a neighboring cathode contact region, and thus to improve a hole injection efficiency by the injection region.

For example, a dose of dopants, e.g. electrically active dopants, of the cathode contact region (electron injection region) may be smaller than $1\times10^{15}$ cm$^{-2}$. This may allow for avoiding bandgap narrowing, and may further allow for improving the n-emitter efficiency, as well as for improving the total area of the p-type injection region at a given forward voltage Vf. This may lead to an improved softness during turn-off.

An example of a method of manufacturing a power semiconductor diode may include providing a semiconductor body having a first main surface and a second main surface opposite to each other along a vertical direction. The method may further include forming an anode region of a first conductivity type in the semiconductor body. The method may further include forming a drift region of a second conductivity type, wherein the drift region is arranged between the anode region and the second main surface. The method may further include forming a field stop region of the second conductivity type, wherein the field stop region is arranged between the drift region and the second main surface. A dopant concentration profile of the field stop region along the vertical direction may include a maximum peak. The method may further include forming an injection region of the first conductivity type, wherein the injection region is arranged between the field stop region and the second main surface. A pn-junction is formed between the injection region and the field stop region. The method may further include forming a cathode contact region of the second conductivity type, wherein the cathode contact region is arranged between the field stop region and the second main surface. A first vertical distance between the pn-junction and the maximum peak may ranges from 200 nm to 1500 nm.

The anode region may be formed by introducing dopants of the first conductivity type, e.g. p-type dopants into the semiconductor body, e.g. by ion implantation process(es) and/or diffusion process(es) through the first main surface. The anode region may be a continuous anode region including a plurality of overlapping anode sub-regions, for example.

The drift region may be formed as part of a semiconductor substrate, e.g. wafer, and/or by one or more epitaxial layers deposited onto a semiconductor substrate, for example.

Each one of the field stop region, the injection region and the cathode contact region may be formed by introducing dopants of the corresponding conductivity type into the semiconductor body, e.g. by ion implantation process(es) and/or diffusion process(es) through the second main surface.

For example, forming the field stop region may include at least one proton implantation process, and wherein a minimum proton implantation energy of the at least one proton implantation process is 150 keV.

For example, forming the field stop region may include at least one proton implantation process, and wherein a tilt angle of the at least one proton implantation process ranges from 30° to 80°. When carrying out multiple proton implantation processes with different tilt angles but same or similar ion implantation energy, a broadened dopant concentration profile, e.g. a profile having a plateau may be achieved, for example.

The examples and features described above and below may be combined.

Functional and structural details described with respect to the examples above shall likewise apply to the exemplary examples illustrated in the figures and described further below.

The examples and features described above and below may be combined.

In the following, further examples of power semiconductor diodes are explained in connection with the accompanying drawings. Functional and structural details described with respect to the examples above shall likewise apply to the exemplary embodiments illustrated in the figures and described further below.

FIG. 1 schematically and exemplarily shows a section of a power semiconductor device 100 in a cross-sectional view.

The power semiconductor diode includes a semiconductor body 102 having a first main surface 104 and a second main surface 106 opposite to each other along a vertical direction y.

A p-doped anode region 108 adjoins to the first main surface 104. An n$^-$-doped a drift region 110 is arranged between the anode region 108 and the second main surface 106. An n-doped field stop region is arranged between the drift region 110 and the second main surface 106. A dopant concentration profile of the field stop region 112 along the vertical direction y includes a maximum peak Pm at a vertical level with respect to the second main surface 106. For example, the field stop region 112 may be doped with hydrogen-related donors.

A p$^+$-doped injection region 116 is arranged between the field stop region 112 and the second main surface 106 and adjoins to the second main surface 106. A pn-junction 118 is formed between the injection region 116 and the field stop region 112.

An n⁺-doped cathode contact region 120 is arranged between the field stop region 112 and the second main surface 106. A first vertical distance d1 between the pn-junction 118 and the maximum peak may range from 200 nm to 1500 nm.

A maximum lateral extension lmax of the injection region 116 may range from $10^{-17}$ cm⁴ times a dopant concentration of the maximum peak Pm to $10^{-14}$ cm⁴ times a dopant concentration of the maximum peak Pm.

A vertical distance between the second main surface 106 and the pn-junction 118 is identified in FIG. 1 as a fifth vertical distance d5. The fifth vertical distance d5 may range from 200 nm to 500 nm, for example.

A dopant concentration ratio between a maximum dopant concentration of the injection region 116 and the maximum peak Pm may be greater than 10, and smaller than 50000.

A maximum dopant concentration of the cathode contact region 120 may be at least a factor 5 greater than a maximum dopant concentration of the injection region 116.

The anode region 108 is electrically connected to an anode terminal L1, e.g. a first load terminal of the power semiconductor diode 100. The illustration of the anode terminal L1 in FIG. 1 is simplified. The anode terminal L1 may include or consist of a conductive material or a combination of conductive materials, for example a doped semiconductor material (e.g., a degenerate doped semiconductor material) such as doped polycrystalline silicon, metal or metal compound, for example. The anode terminal L1 may also include a combination of these materials, e.g. a liner or adhesion material and an electrode material. Exemplary contact materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example. The anode terminal L1 may constitute or be part of a wiring area formed over the semiconductor body 102. The wiring area may include one, two, three or even more wiring levels that may include patterned or non-patterned metal layers and interlayer dielectrics arranged between the patterned or non-patterned metal layers. Vias may electrically interconnect the different wiring levels, for example. A part of the anode terminal L1, e.g. contacts plug(s), may directly adjoin the semiconductor body 102 at the first surface 104.

The cathode contact region 120 and the injection region 116 are electrically connected to a cathode terminal L2 at the second main surface 106. Details provided above with respect to the anode terminal L1, e.g. exemplary materials likewise apply to the cathode terminal L2.

Figure 2:
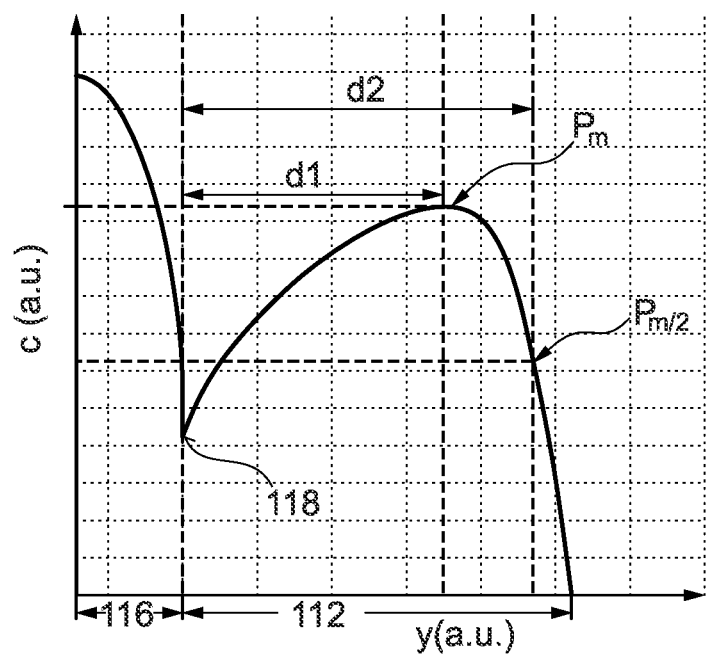
FIGS. 2 and 3 are schematic graphs for illustrating exemplary dopant concentration profiles c of the power semiconductor diode of FIG. 1 along a vertical direction y.

The schematic graph of FIG. 2 illustrates an exemplary dopant concentration profile c of the power semiconductor diode 100 of FIG. 1 along the vertical direction y. The dopant concentration profile c of the field stop region 112 along the vertical direction y includes a single peak and decreases, along the vertical direction y toward the first main surface 104, from the maximum peak Pm to half of the maximum peak Pm/2 at a second vertical distance d2 to the pn-junction 118. A ratio between the second vertical distance d2 and the first vertical distance d1 may range from 1.42 and 2.2. A dose of dopants of the field stop region 112 may be smaller than $1 \times 10^{13}$ cm⁻², and may be determined by integrating the profile c along the vertical extension of the field stop region 112.

Figure 3:
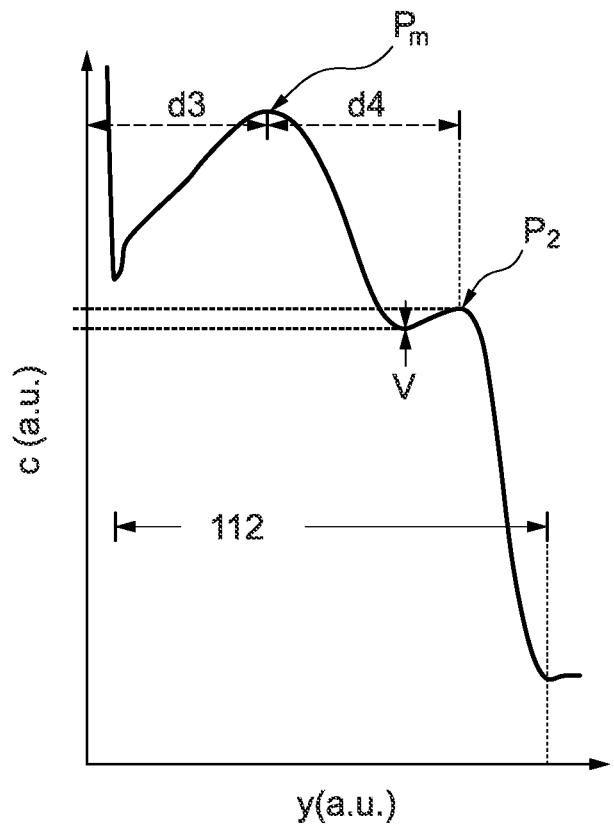

The schematic graph of FIG. 3 illustrates a further exemplary dopant concentration profile c of the power semiconductor diode 100 of FIG. 1 along the vertical direction y. The dopant concentration profile c of the field stop region 112 along the vertical direction y includes a second peak P2, and the maximum peak Pm is located between the second peak P2 and the second main surface 106. The dopant concentration profile c of the field stop region 112 along the vertical direction y includes a minimum V between the maximum peak Pm and the second peak P2. A dopant concentration ratio between the minimum V and the second peak P2 may range from 0.7 to 0.95.

A vertical distance between the maximum peak Pm and the second main surface 106 is identified in FIG. 3 as a third vertical distance d3, and a vertical distance between the maximum peak Pm and the second peak is identified in FIG. 3 as a fourth vertical distance d4. A ratio between the fourth vertical distance d4 and the third vertical distance d3 may range from 0.5 to 2.0. The third vertical distance d3 may be smaller than 2.5 μm.

The dopant concentration of the minimum V may be at least a factor ten greater than a mean dopant concentration of the drift region 110.

Figure 4:
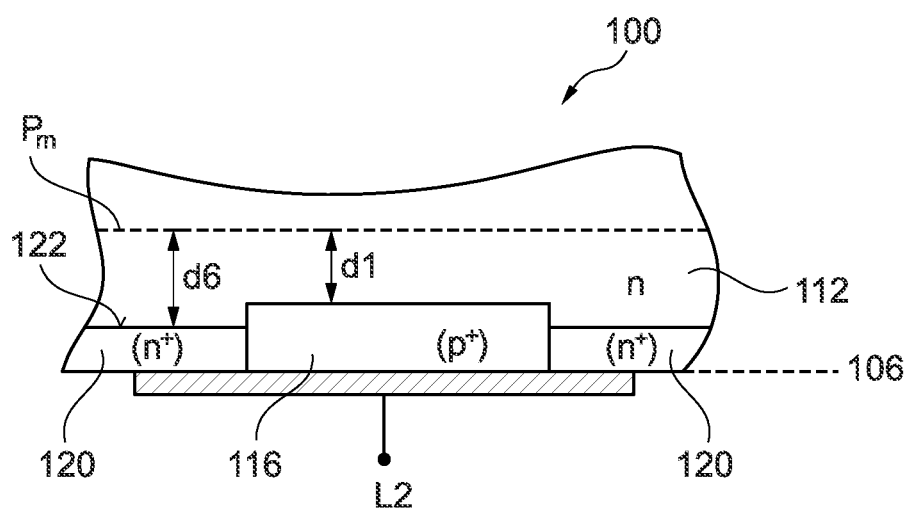
FIG. 4 is a schematic cross-sectional view for illustrating an exemplary design of a cathode contact region and an injection region at a second main surface of a power semiconductor diode.

In the schematic cross-sectional view of FIG. 4, a vertical distance between the maximum peak Pm and an interface 122 between the field stop region 112 and the cathode contact region 120 is identified as a sixth vertical distance d6. The first vertical distance d1 is smaller than the sixth vertical distance d6. In some other examples d1=d6 or d1>d6 may be valid.

It will be appreciated that while the method is described above and below as a series of steps or events, the described ordering of such steps or events are not to be interpreted in a limiting sense. Rather, some steps may occur in different orders and/or concurrently with other steps or events apart from those described above and below.

Figure 5:
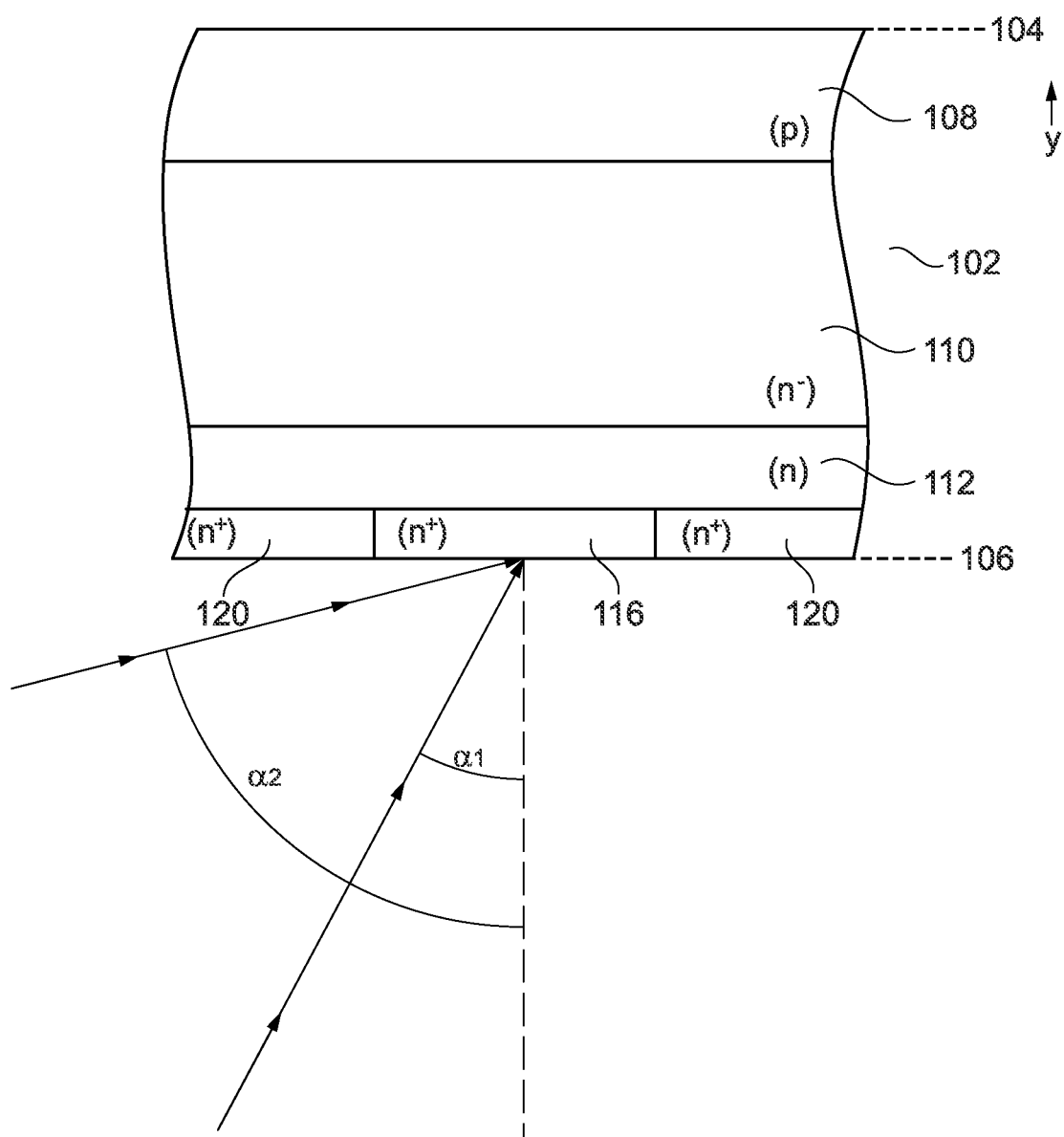
FIG. 5 is a schematic cross-sectional view for illustrating an exemplary part of a process for forming a field stop region of the power semiconductor diode of FIG. 1.

An exemplary method of manufacturing power semiconductor diodes 100 is illustrated in the schematic cross-sectional view of FIG. 5.

The view of FIG. 5 illustrates part of a process of forming the field stop region 112 by at least one proton implantation process, wherein a tilt angle of the at least one proton implantation process ranges from α1=30° to α2=80°. In addition to proton implantation processes using tilt angles between α1 and α2, further non-tilted ion implantation processes may be used for forming the field stop region 112. In some examples, the field stop region 112 may be formed after forming the injection region 116 and the cathode contact region 120.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor diode, comprising:
    a semiconductor body having a first main surface and a second main surface opposite to each other along a vertical direction;

an anode region of a first conductivity type;
a drift region of a second conductivity type, wherein the drift region is arranged between the anode region and the second main surface;
a field stop region of the second conductivity type, wherein the field stop region is arranged between the drift region and the second main surface, and a dopant concentration profile of the field stop region along the vertical direction includes a maximum peak;
an injection region of the first conductivity type, wherein the injection region is arranged between the field stop region and the second main surface, and a pn-junction is formed between the injection region and the field stop region; and
a cathode contact region of the second conductivity type, wherein the cathode contact region is arranged between the field stop region and the second main surface,
wherein a first vertical distance between the pn-junction and the maximum peak ranges from 200 nm to 1500 nm.

2. The power semiconductor diode of claim 1, wherein the dopant concentration profile of the field stop region decreases, along the vertical direction toward the first main surface, from the maximum peak to half of the maximum peak at a second vertical distance to the pn-junction, and wherein a ratio between the second vertical distance and the first vertical distance ranges from 1.42 and 2.2.

3. The power semiconductor diode of claim 1, wherein a dose of dopants of the field stop region is smaller than $1\times10^{13}$ cm$^{-2}$.

4. The power semiconductor diode of claim 1, wherein the dopant concentration profile of the field stop region along the vertical direction includes a single peak.

5. The power semiconductor diode of claim 1, wherein the dopant concentration profile of the field stop region along the vertical direction includes a second peak, and the maximum peak is located between the second peak and the second main surface.

6. The power semiconductor diode of claim 5, wherein the dopant concentration profile of the field stop region along the vertical direction includes a minimum between the maximum peak and the second peak, and wherein a dopant concentration ratio between the minimum and the second peak ranges from 0.7 to 0.95.

7. The power semiconductor diode of claim 5, further comprising a third vertical distance between the maximum peak and the second main surface, and a fourth vertical distance between the maximum peak and the second peak, and wherein a ratio between the fourth vertical distance and the third vertical distance ranges from 0.5 to 2.0.

8. The power semiconductor diode of claim 7, wherein the third vertical distance is smaller than 2.5 µm.

9. The power semiconductor diode of claim 1, wherein the dopant concentration profile of the field stop region along the vertical direction includes at least one minimum, and wherein a dopant concentration of the at least one minimum is at least a factor ten greater than a mean dopant concentration of the drift region.

10. The power semiconductor diode of claim 1, wherein a dopant concentration ratio between a maximum dopant concentration of the injection region and the maximum peak is greater than 10.

11. The power semiconductor diode of claim 1, wherein a dopant concentration ratio between a maximum dopant concentration of the injection region and the maximum peak is smaller than 50000.

12. The power semiconductor diode of claim 1, wherein a maximum dopant concentration of the cathode contact region is at least a factor 5 greater than a maximum dopant concentration of the injection region.

13. The power semiconductor diode of claim 1, further comprising a fifth vertical distance between the second main surface and the pn-junction, and wherein the fifth vertical distance ranges from 200 nm to 500 nm.

14. The power semiconductor diode of claim 1, wherein the field stop region includes hydrogen-related donors.

15. The power semiconductor diode of claim 1, wherein a maximum lateral extension of the injection region ranges from $10^{-17}$ cm$^4$×dopant concentration of the maximum peak to $10^{-14}$ cm$^4$×dopant concentration of the maximum peak.

16. The power semiconductor diode of claim 1, further comprising a sixth vertical distance between the maximum peak and an interface between the field stop region and the cathode contact region, and wherein the first vertical distance is smaller than the sixth vertical distance.

17. The power semiconductor diode of claim 1, wherein a dose of dopants of the cathode contact region is smaller than $1\times10^{15}$ cm$^{-2}$.

18. A method of manufacturing a power semiconductor diode, the method comprising:
providing a semiconductor body having a first main surface and a second main surface opposite to each other along a vertical direction;
forming an anode region of a first conductivity type in the semiconductor body;
forming a drift region of a second conductivity type, wherein the drift region is arranged between the anode region and the second main surface;
forming a field stop region of the second conductivity type, wherein the field stop region is arranged between the drift region and the second main surface, and a dopant concentration profile of the field stop region along the vertical direction includes a maximum peak;
forming an injection region of the first conductivity type, wherein the injection region is arranged between the field stop region and the second main surface, and a pn-junction is formed between the injection region and the field stop region; and
forming a cathode contact region of the second conductivity type, wherein the cathode contact region is arranged between the field stop region and the second main surface,
wherein a first vertical distance between the pn-junction and the maximum peak ranges from 200 nm to 1500 nm.

19. The method of claim 18, wherein forming the field stop region comprises at least one proton implantation process, and wherein a minimum proton implantation energy of the at least one proton implantation process is 150 keV.

20. The method of claim 18, wherein forming the field stop region comprises at least one proton implantation process, and wherein a tilt angle of the at least one proton implantation process ranges from 30° to 80°.

* * * * *